(12) United States Patent
Snider et al.

(10) Patent No.: US 7,436,209 B1
(45) Date of Patent: Oct. 14, 2008

(54) NANOSCALE ELECTRONIC LATCH

(75) Inventors: Gregory S. Snider, Mountain View, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/590,491

(22) Filed: Oct. 30, 2006

Related U.S. Application Data

(63) Continuation-in-part of application No. 11/136,935, filed on May 24, 2005, now Pat. No. 7,307,448, and a continuation-in-part of application No. 11/136,950, filed on May 24, 2005, now Pat. No. 7,257,016.

(51) Int. Cl.
*H03K 19/177* (2006.01)

(52) U.S. Cl. .......................................... 326/38; 326/41

(58) Field of Classification Search ............. 326/37–41, 326/46
See application file for complete search history.

(56) References Cited

U.S. PATENT DOCUMENTS 6,870,394 B2 * 3/2005 Kuekes ........................ 326/41

* cited by examiner

*Primary Examiner*—Don P Le

(57) ABSTRACT

In one embodiment of the present invention, a nanoscale latch is implemented by interconnecting an enable line, two control lines, and a pull-down line, when needed, to a signal line carrying encoded binary values to be latched and subsequently output. The enable line is interconnected with the signal line through a field-effect-transistor-like nanoscale junction. Both control lines are interconnected with the signal line through asymmetric-switch nanoscale junctions of like polarities. The pull-down line, when needed, is interconnected with the signal line through a resistive nanoscale junction. Inputting a sequence of signals to the enable and control lines allows a value input from the signal line to be stored and subsequently output to the signal line. In various additional embodiments, an array of nanoscale latches can be implemented by overlaying enable and control lines, and a pull-down line when needed, over a set of parallel nanowires.

20 Claims, 13 Drawing Sheets

US 7,436,209 B1

NANOSCALE ELECTRONIC LATCH

CROSS-REFERENCES TO RELATED APPLICATIONS

This application is a continuation-in-part of U.S. application Ser. Nos. 11/136,935 now U.S. Pat. No. 7,307,448 and 11/136,950 now U.S. Pat. No. 7,257,016, both filed May 24, 2005.

STATEMENT OF GOVERNMENT INTEREST

This invention has been made with Government support under Contract No. HR 0011-05-03-0001, awarded by the Defense Advanced Research Projects Agency. The government has certain rights in the invention.

TECHNICAL FIELD

The present invention is related to both electronics and nanotechnology and, in particular, to a nanoscale electronic latch that can be implemented using nanowire-crossbar technologies.

BACKGROUND OF THE INVENTION

Electronic latches are used in many types of electronic devices, from macroscale electronics to integrated circuits. Because electronic latches are fundamental components of electronic circuits and devices, nanoscale electronic latches are needed for nanoelectronic circuits and devices created by emerging molecular-electronics-fabrication techniques. A number of different types of nanoscale latches have been proposed. However, the previously proposed nanoscale latches employed asymmetric switches of opposing polarities. Fabricating a single nanoscale device with asymmetric switches of opposing polarities may difficult and expensive. Researchers, developers, and manufacturers of nanoscale electronic devices have all recognized the need for devising new types of nanoscale latches with properties and characteristics conducive to high-volume manufacture for commercial applications.

SUMMARY OF THE INVENTION

In one embodiment of the present invention, a nanoscale latch is implemented by interconnecting an enable line, two control lines, and a pull-down line, when needed, to a signal line carrying encoded binary values to be latched and subsequently output. The enable line is interconnected with the signal line through a field-effect-transistor-like nanoscale junction. Both control lines are interconnected with the signal line through asymmetric-switch nanoscale junctions of like polarities. The pull-down line, when needed, is interconnected with the signal line through a resistive nanoscale junction. Inputting a sequence of signals to the enable and control lines allows a value input from the signal line to be stored and subsequently output to the signal line. In various additional embodiments, an array of nanoscale latches can be implemented by overlaying enable and control lines, and a pull-down line when needed, over a set of parallel nanowires.

DETAILED DESCRIPTION OF THE INVENTION

The present invention is related to the emerging fields of molecular electronics and nanotechnology. The present invention provides for a relatively easily and economically fabricated nanoscale electronic latch ("NEL"). Arrays of NELs are readily implemented from sets of parallel nanowires. The term "nanoscale" is used to characterize components or objects having at least one dimension of between 0.5 nanometers and 5 nanometers, or more generally having at least one dimension of between 0.5 nanometers and 50 nanometers.

Figure 1A:
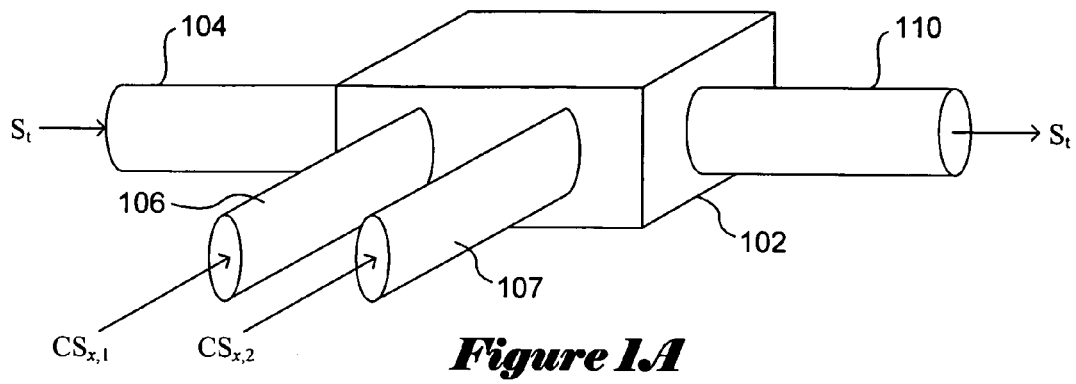
FIGS. 1A-D illustrate operation of a generalized electronic latch.

FIGS. 1A-D illustrate operation of a generalized electronic latch. As shown in FIG. 1A, and in subsequent figures, the latch 102 has an input signal line 104, several control signal lines 106 and 107, and an output signal line 110. In the latch state illustrated in FIG. 1A, control signals $CS_{x,1}$ and $CS_{x,2}$ input on the two control signal lines 106 and 107 place the latch in a neutral state, in which a binary value, represented in FIG. 1A by the symbol "$S_t$," is present on both the input signal line 104 and the output signal line 110. In other words, in the neutral state, the input and output signal lines are connected and transmit signals unaffected by the latch. The generalized latch employs two control signal lines, although an electronic latch may employ two or more control signal lines.

Figure 1B:
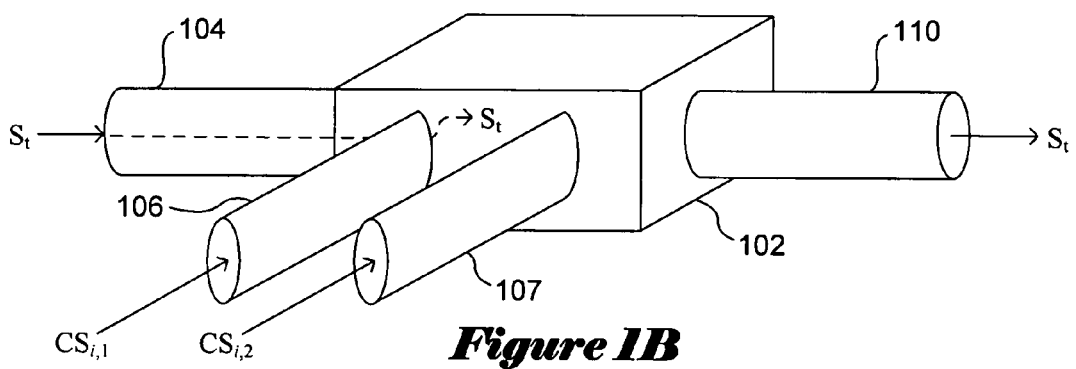
Figure 1C:
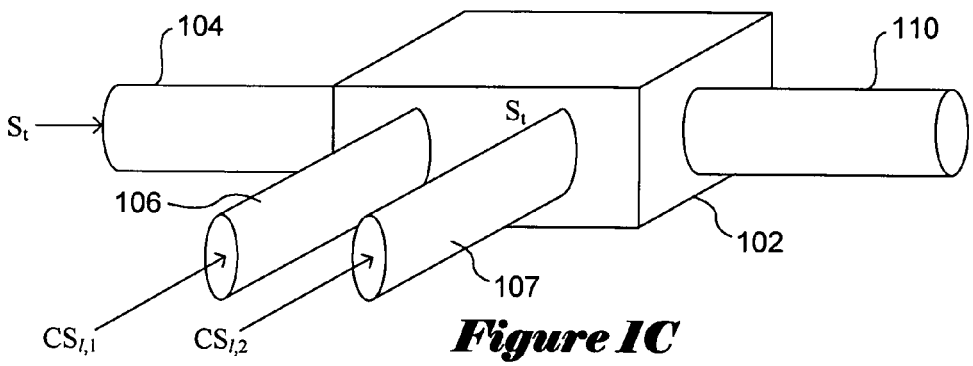
Figure 1D:
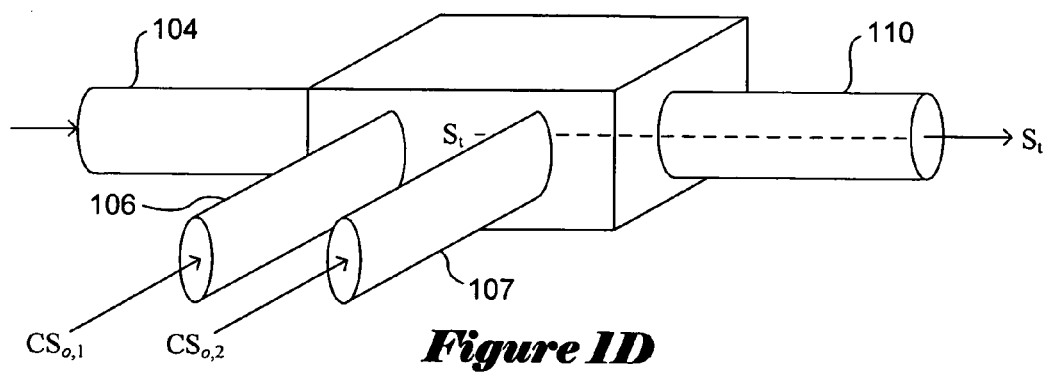

FIGS. 1B-C illustrate latching of a binary value. In FIG. 1B, input control signals $CS_{i,1}$ and $CS_{i,2}$ to the control signal lines causes the current binary value on the signal line 104 and 110 to be stored within the latch by a change of state of the latch. Application of the latch signals $CS_{l,1}$ and $CS_{l,2}$ to the control signal lines 106 and 107 secure storage of the binary value $S_t$ in the latch 102 and disconnect the input signal line 104 from the output signal line 110. At a subsequent time, as shown in FIG. 1D, control signals $CS_{o,1}$, and $CS_{o,2}$ are input to the control signal lines 106 and 107 to output the stored value $S_t$ from the latch to the output signal line 110.

Figure 2:
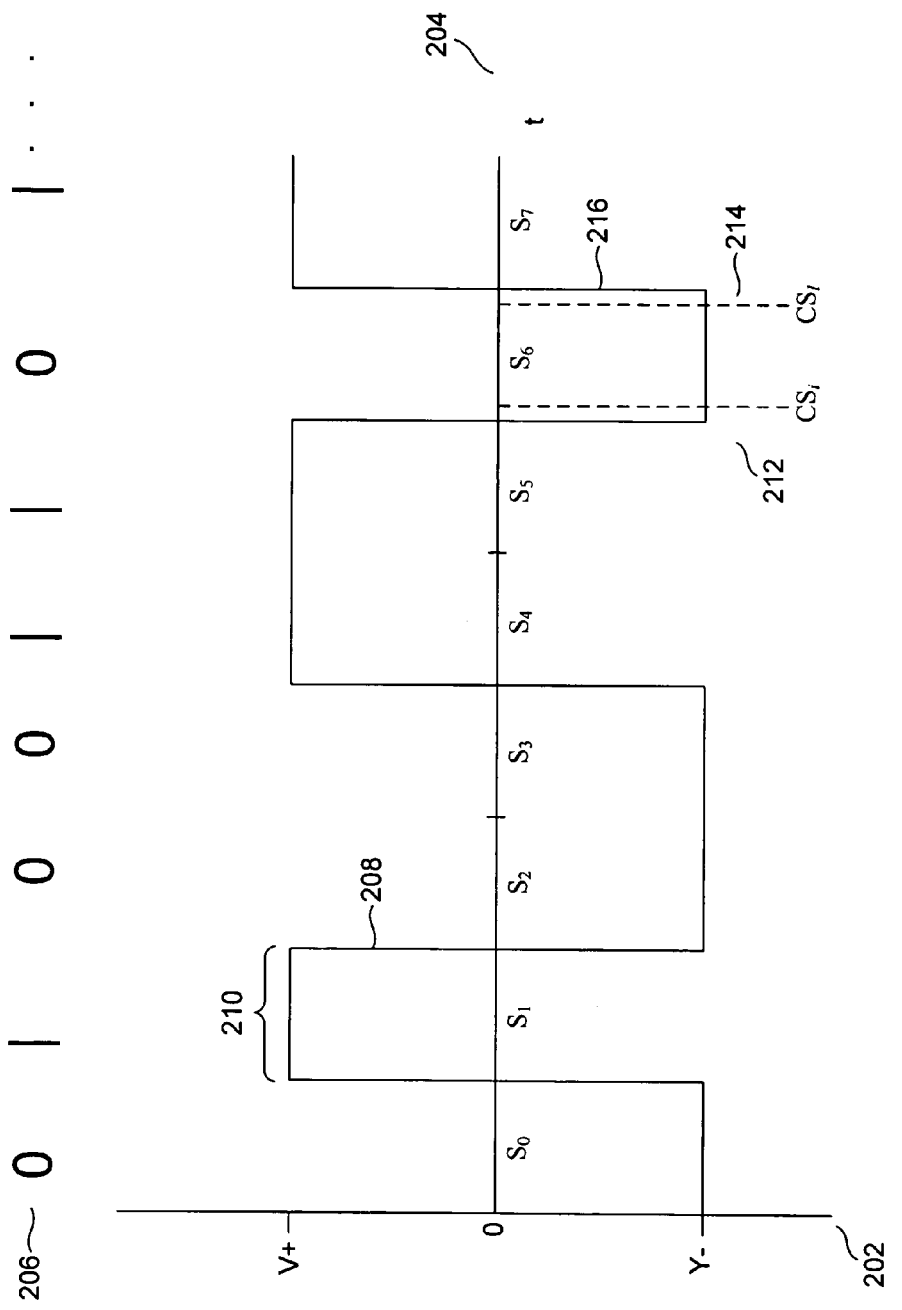
FIG. 2 illustrates a small portion of a binary signal that may be input to the input signal line of the generalized latch discussed with reference to FIGS. 1A-D.

FIG. 2 illustrates a small portion of a binary signal that may be input to the input signal line of the generalized latch discussed with reference to FIGS. 1A-D. In FIG. 2, the vertical axis 202 represents voltage on the input signal line of the latch and the horizontal axis 204 represents time. The digital signal comprises a sequence, in time, of negative and positive voltage pulses, with positive-voltage pulses representing one or more binary digits "1," and negative voltage pulses representing one or more binary digits "0." The signal is clocked at equal-length intervals, with each clock tick representing a single binary digit. The binary digits represented by the signal are shown in a horizontal row 206 above the signal 208 plotted with respect to the vertical and horizontal axes 202 and 204. In FIG. 2, the width 210 of the first positive-voltage pulse represents a single clock tick. In order to latch a particular binary value within a digital signal, either the control signals are clocked at a higher rate, so that the input-control signals $CS_i$ and latch control signals $CS_l$ can be sequentially applied 212 and 214 within a single voltage pulse 216, or, alternatively, the signal line needs to be held to a single voltage for a sufficient amount of time for input signals $CS_i$ and latch signal $CS_l$ to be applied via the control signal lines before the polarity of the input signal changes.

Figure 3A:
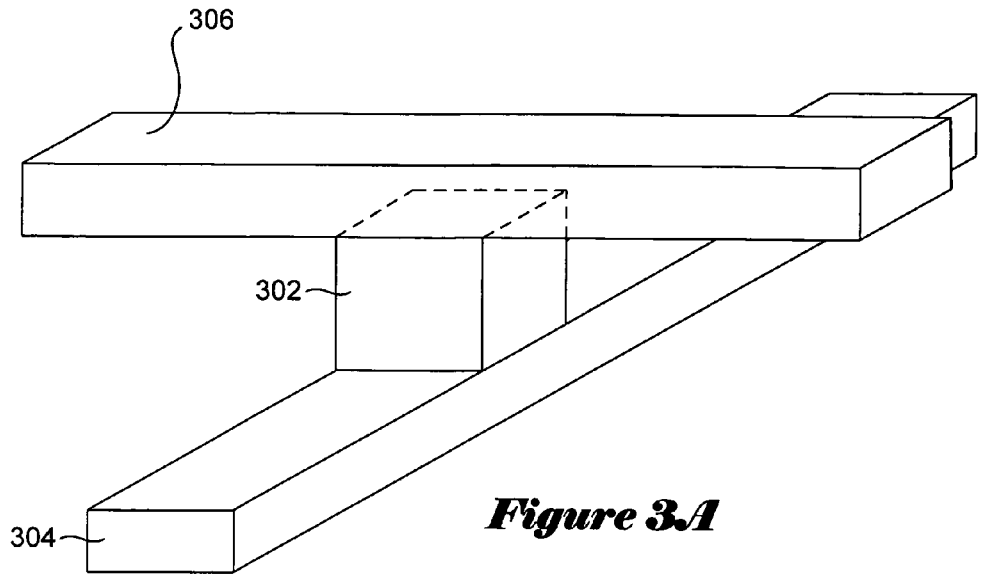
FIGS. 3A-C illustrate various types of nanoscale junctions.
Figure 3B:
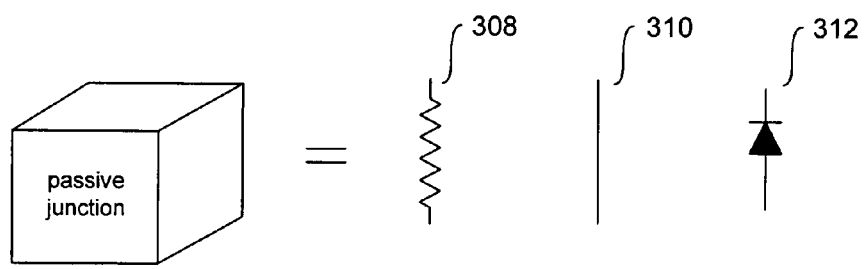
Figure 3C:
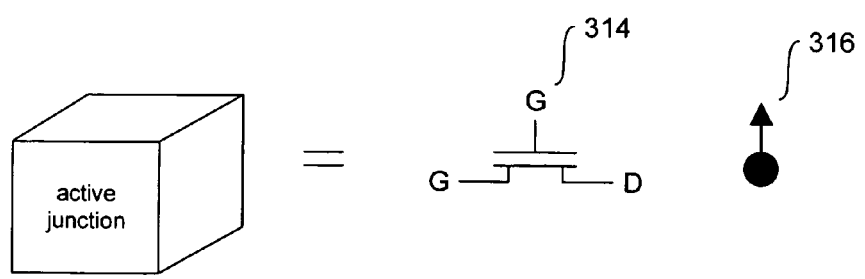

FIGS. 3A-C illustrate various types of nanoscale junctions. As shown in FIG. 3A, a nanoscale junction 302 occurs at the position of smallest separation between a first nanowire, submicron-scale wire, of microscale wire 304 and a second nanowire, submicron-scale wire, of microscale wire 306 approximately perpendicular to the first nanowire. The word "nanoscale" in the phrase "nanoscale junction" refers principally to the separation between the two nanowire, submicron-scale wire, of microscale wires. A nanoscale junction may, for example, reside between two microscale signal lines, two nanowires, or a nanowire and a microscale signal line. In certain fabrication techniques, nanoscale junctions may be formed as separate layers between nanowires and/or microscale signal lines, as shown in FIG. 3A, and, in other cases, nanoscale junctions can be formed by simply overlying a first nanowire and/or microscale signal line with a second nanowire and/or microscale signal line. Nanoscale junctions are commonly implemented in nanowire crossbars consisting of a first layer of parallel nanowires and a second layer of parallel nanowires approximately perpendicular to the first set of parallel nanowires, with nanoscale junctions forming a grid at the points of closest overlap of the two layers of nanowires. Nanoscale junctions are also commonly implemented in mixed-scale crossbars, in which a layer of parallel microscale signal lines overlie a layer of parallel nanowires.

By choosing the types of molecules used in the nanoscale junctions, and by, in certain embodiments, configuring the nanoscale junctions chemically or electronically, a number of different types of nanoscale junctions can be formed, each type having a characteristic set of electronic properties, often analogous to the electronic properties of familiar, microscale and macroscale electronic components. FIG. 3B shows a variety of types of passive nanoscale junctions that can be fabricated. As shown in FIG. 3B, passive nanoscale junctions include nanoscale junctions that behave electronically as resistors 308, conductive connections 310, and diodes 312. As shown in FIG. 3C, active nanoscale junctions can be fabricated with properties analogous to a field-effect transistor 314 or with the properties of an asymmetric switch 316, both active nanoscale junctions described in greater detail below.

Figure 4A:
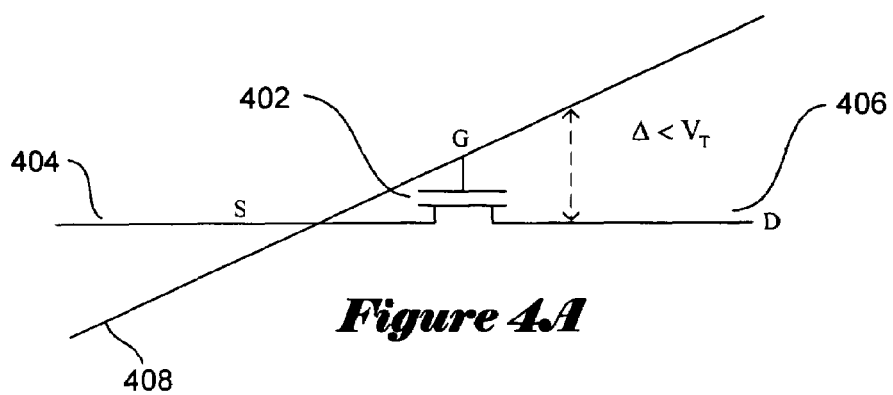
FIGS. 4A-C illustrate a field-effect-transistor-like nanoscale junction.
Figure 4B:
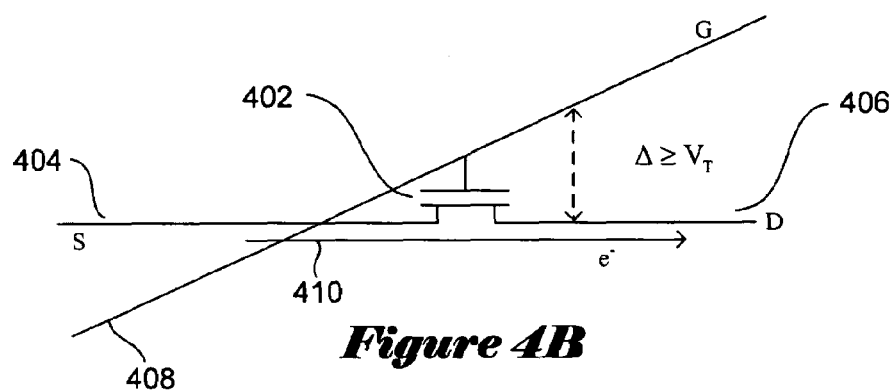
Figure 4C:
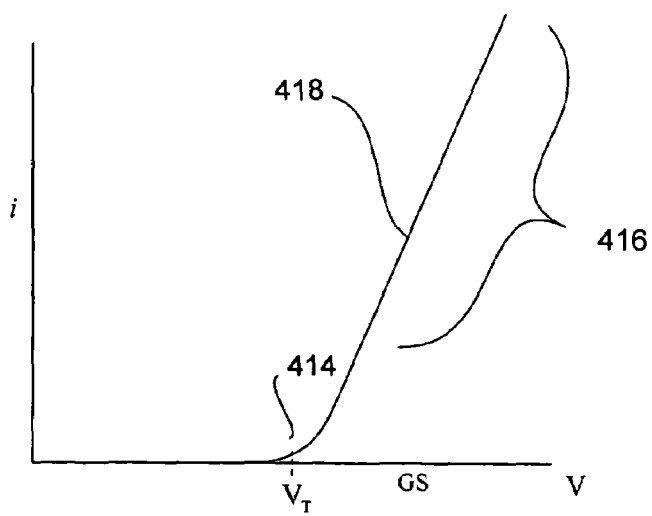

FIGS. 4A-C illustrate a field-effect-transistor-like nanoscale junction. In FIGS. 4A-C, the field effect-transistor ("FET") symbol (314 in FIG. 3C) is used to represent the nanoscale junction. As shown in FIG. 4A, when the voltage potential A across the nanoscale junction 402 is less than a threshold voltage $V_T$, the FET-like nanoscale junction acts as an open switch, preventing current flow from the source, or input side 404 of the horizontally displayed nanowire to the drain, or output side 406 of the horizontally displayed nanowire. In other words, the upper nanowire 408 acts as a gate of a FET, controlling signal passage through the FET. As shown in FIG. 4B, when the voltage potential A across the nanoscale junction of 402 is greater than or equal to the threshold voltage $V_T$, the nanoscale junction acts as a closed switch, and current can flow 410 from the source side 404 of the horizontally displayed nanowire to the drain side 406 of the horizontally displayed nanowire. FIG. 4C illustrates a plot of current versus gate-to-source voltage potential for the FET-like nanoscale junction. As shown in the graph in FIG. 4C, little current i flows between the source and drain sides of the nanowire controlled by the FET-like nanoscale junction until the voltage reaches the threshold voltage $V_T$ 414. At that point, the FET-like nanoscale junction acts likes a closed switch, and current flow through the horizontally displayed nanowire is proportional to voltage over a linear portion 416 of the current/voltage curve 418.

Figure 5A:
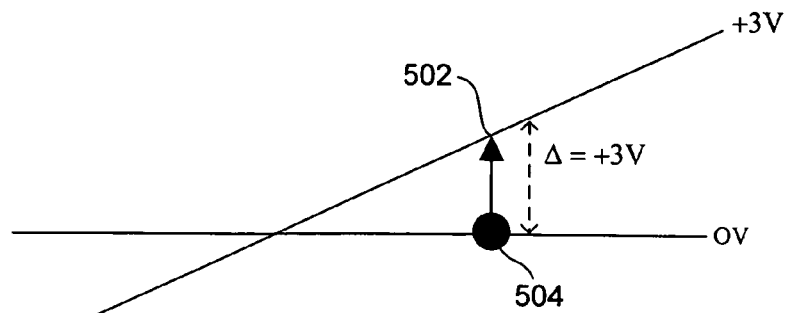
FIGS. 5A-D illustrate characteristics of an asymmetric-switch nanoscale junction.
Figure 5B:
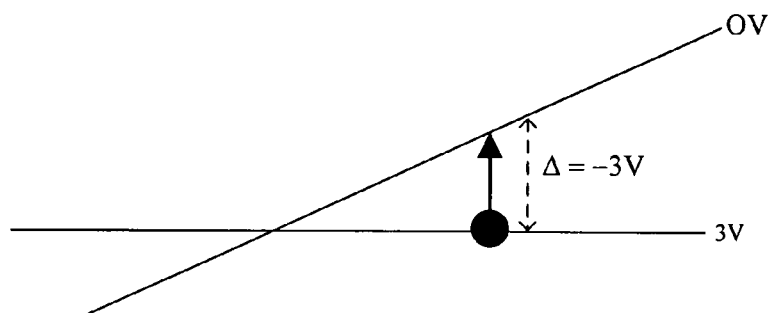
Figure 5C:
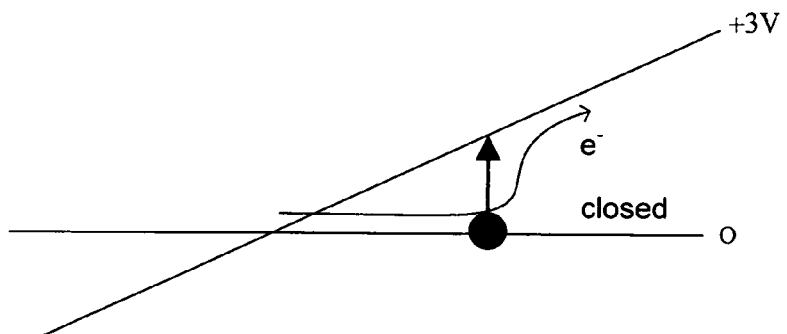
Figure 5D:
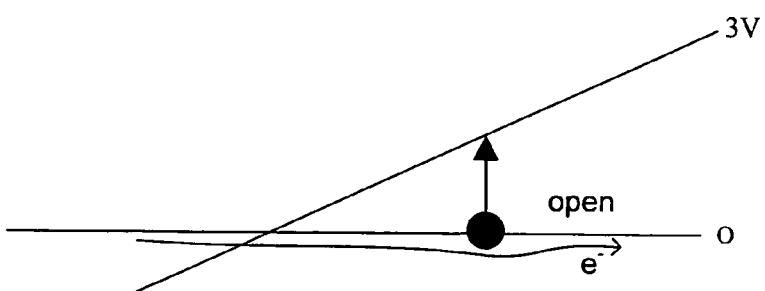

FIGS. 5A-D illustrate characteristics of an asymmetric-switch nanoscale junction. In FIGS. 5A-D, the nanoscale junction is represented by the asymmetric-switch symbol (316 in FIG. 3C). An asymmetric switch has a direction, or polarity, represented by the arrow portion of the asymmetric-switch symbol. As shown in FIG. 5A, a positive voltage drop occurs when the voltage at the tip of the arrow 502 is more positive than the voltage at the ball end of the asymmetric switch 504, as shown in FIG. 5B. Reversing the voltages from those shown in FIG. 5A results in a negative voltage drop across the molecular switch. An asymmetric switch has two different states. In a first state shown in FIG. 5C, referred to as the "closed" state, the asymmetric switch has low impedance, and current may flow through the asymmetric switch. In a second state, referred to as "open," shown in FIG. 5D, the asymmetric switch has high impedance, and resists the flow of current through the asymmetric switch.

Figure 6:
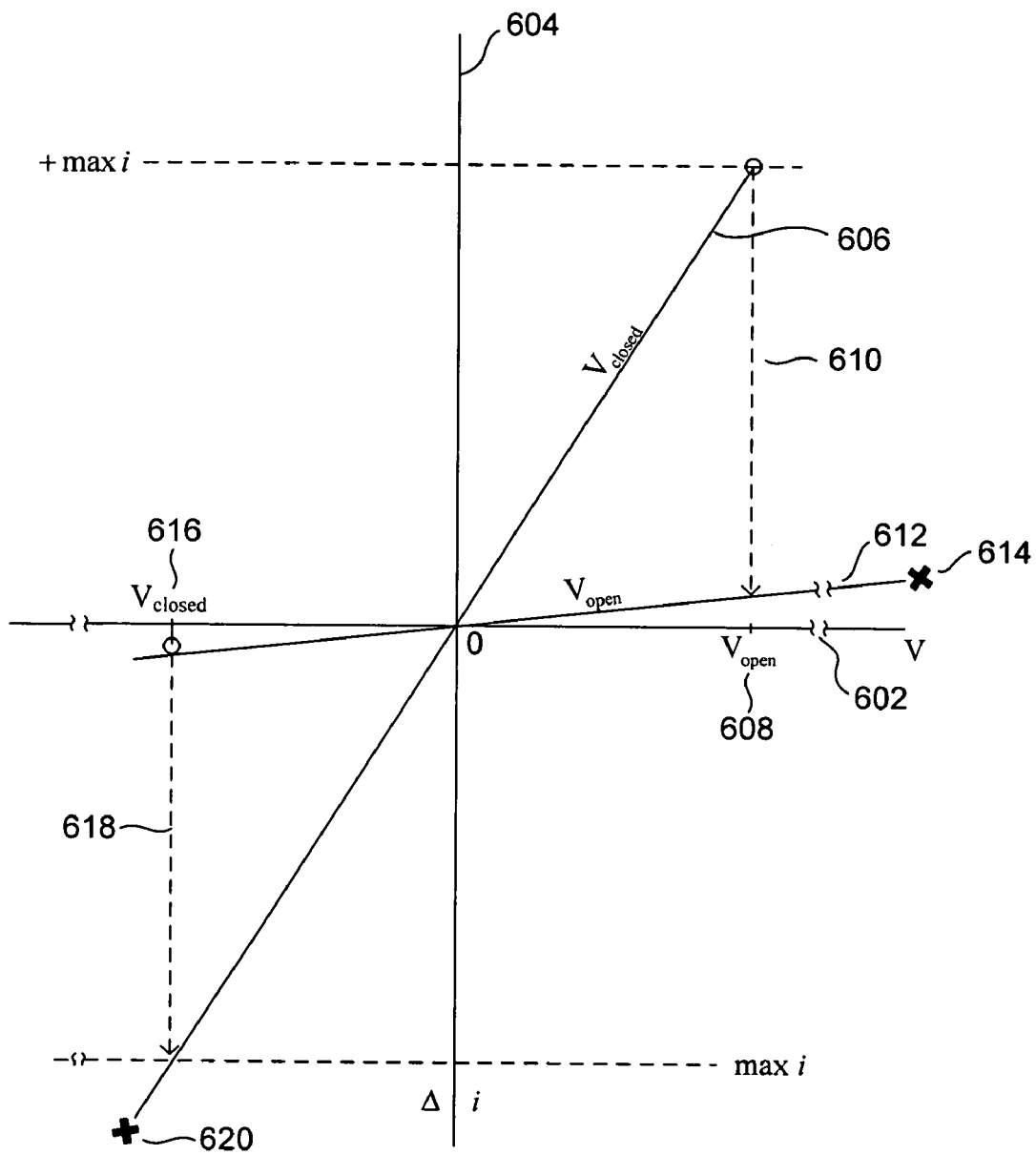
FIG. 6 illustrates the voltage/current behavior of an asymmetric-switch nanoscale junction.

FIG. 6 illustrates the voltage/current behavior of an asymmetric-switch nanoscale junction. In FIG. 6, the voltage potential across the asymmetric-switch nanoscale junction is plotted with respect to the horizontal axis 602 and the current flowing through the asymmetric-switch nanoscale junction is plotted with respect to the vertical axis 604. Line segment 606 shows the current/voltage curve for an asymmetric-switch nanoscale junction in the "closed" state. As discussed above, in the closed state, an asymmetric-switch nanoscale junction has low impedance, and readily conducts current. As the voltage increases in a positive direction, positive flow of current increases correspondingly. However, at a positive voltage of $V_{open}$ 608, the asymmetric-switch nanoscale junction transitions from the $V_{close}$ to the $V_{open}$ state, as shown in FIG. 6 by the dashed arrow 610. Line segment 612 is the voltage/current curve for the asymmetric-switch nanoscale junction in the open state. In the open state, the asymmetric-switch nanoscale junction exhibits high impedance, and low conductance of current. Were the voltage to continue to be increased, the asymmetric-switch nanoscale junction would ultimately fail, as indicated by the "X" symbol 614. As the voltage is decreased from the $V_{close}$ past 0 volts, represented by the origin of the coordinate axes, towards the left-hand portion of the graph, the switch remains in the open state, with high impedance, until a negative voltage differential of $V_{open}$ 616 is reached. At this voltage, as indicated by arrow 618 in FIG. 6, the asymmetric-switch nanoscale junction transitions from the open state to the closed state. A further decrease in voltage eventually leads to failure of the asymmetric-switch nanoscale junction, as represented by the "X" symbol 620. Thus, when the voltage applied to the asymmetric-switch nanoscale junction is greater than $V_{open}$ and less than $V_{close}$, the asymmetric-switch nanoscale junction remains in whichever of the two states open and closed that the asymmetric-switch nanoscale junction was last placed in. When the voltage rises above $V_{open}$, and the asymmetric-switch nanoscale junction is in the closed state, the asymmetric-switch nanoscale junction transitions from the closed state to the open state. When the voltage falls to $V_{close}$, and the asymmetric-switch nanoscale junction is in the open state, the asymmetric-switch nanoscale junction transitions to the closed state.

Asymmetric-switch nanoscale junctions are described, above, as having a fixed polarity, with $V_{close}$ a relatively negative voltage and $V_{open}$ a relatively positive voltage. Asymmetric-switch nanoscale junctions can also be fabricated to have an opposite polarity, with $V_{close}$ a relatively positive voltage and $V_{open}$ a relatively negative voltage. An opposite-polarity asymmetric-switch nanoscale junction would be described by a modified voltage/current plot similar to the voltage/current plot of FIG. 6, but with the directions of the dashed-line arrows 610 and 618 reversed.

Figure 7:
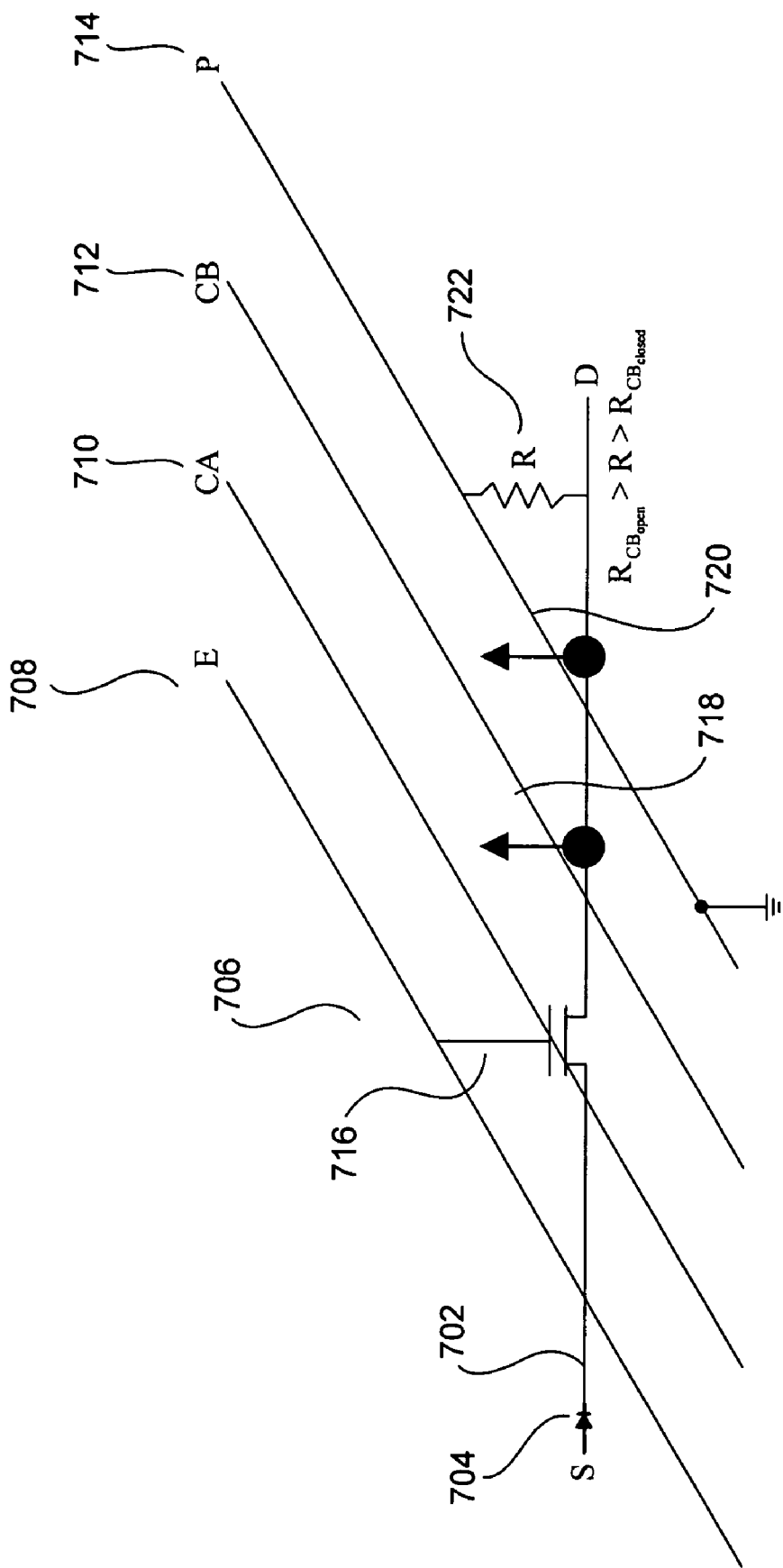
FIG. 7 illustrates a single-signal-line, nanoscale electronic latch that represents one embodiment of the present invention.

FIG. 7 illustrates a single-signal-line, nanoscale electronic latch that represents one embodiment of the present invention. The latch includes a signal line 702 with one-directional current flow, as indicated by the diode symbol 704 at the left-hand side of the signal line. The nanoscale electronic latch ("NEL") 706 comprises four nanoscale junctions connecting the signal line 702 to an enable line 708, two control lines "A," and "B" 710 and 712, respectively, and a pull-down line 714. The enable line is interconnected with the signal line 702 through a FET-like nanoscale junction 716. Both the control A and control-B signal lines 710 and 712 are interconnected with the signal line 704 by asymmetric-switch nanoscale junctions 718 and 720 with polarities as described with reference to FIGS. 5A-D and 6. Opposite-polarity asymmetric-switch nanoscale junctions can also be used, with their directions in the NEL opposite. from those shown in FIG. 7. Note the identical polarities of the asymmetric-switch nanoscale junctions. Finally, the pull-down line 714 is connected to the signal line via a resistor-like nanoscale junction 722 with a resistance less than the resistance of the asymmetric-switch nanoscale junctions 718 and 720 when the two asymmetric-switch nanoscale junctions are in the open state, but greater than the resistance of the two asymmetric-switch nanoscale junctions 718 and 720 when the asymmetric-switch nanoscale junctions are in the closed state.

Figure 8A:
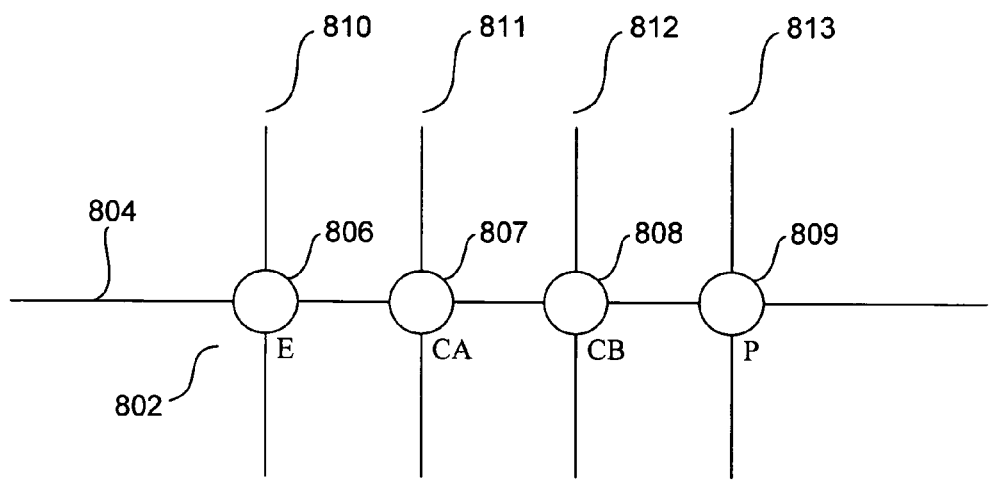
FIGS. 8A-B show illustration conventions used in subsequent figures to illustrate operation of the NEL shown in FIG. 7.
Figure 8B:
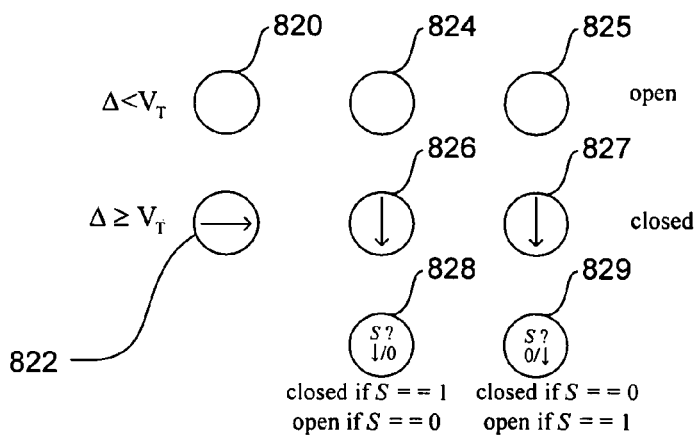
Figure 8B:
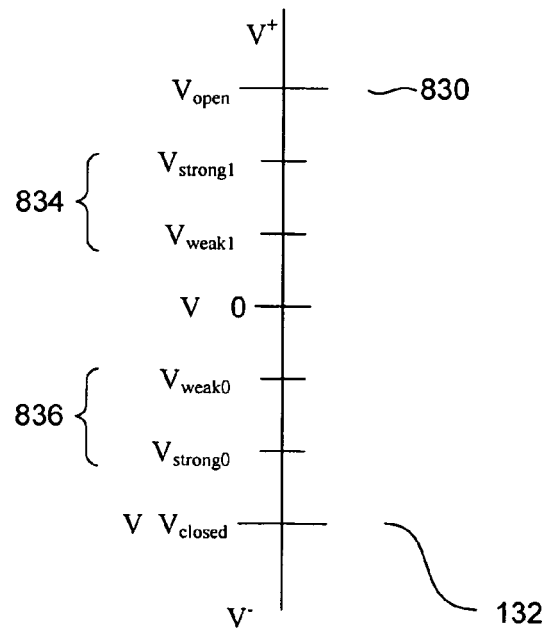

FIGS. 8A-B show illustration conventions used in subsequent figures to illustrate operation of the NEL shown in FIG. 7. As shown in FIG. 8A, the NEL 802 is represented by a horizontal line 804 representing the signal line (702 in FIG. 7) and four unfilled disks 806-809 that represent the FET-like nanoscale junction 716 in FIG. 7, the first asymmetric-switch nanoscale junction (718 in FIG. 7), the second asymmetric-switch nanoscale junction (720 in FIG. 7), and the resistive nanoscale junction (722 in FIG. 7), respectively. The enable "E," control-A "CA," control-B "CB," and pull-down "P" signal lines (708, 710, 712, and 714 in FIG. 7) are represented by vertical lines 810-813 in FIG. 8A, respectively. As also shown in FIG. 8A, various symbols are used to indicate the states of the active molecular switches. When a voltage less than $V_T$ is applied to the FET-like nanoscale junction, the FET acts as an open switch on the signal line, and the FET-like nanoscale junction is represented as an unfilled disk 820. However, when a voltage greater than $V_T$ is applied across the FET-like nanoscale junction, the FET-like nanoscale junction acts as a closed switch, represented by a disk with a rightward pointing arrow 822. Similarly, the asymmetric-switch nanoscale junctions are illustrated as unfilled circles in the open states 824-825 and with downward pointing arrows in the closed states 826 and 827. Two additional pseudo states are possible for the asymmetric-switch nanoscale junctions, represented with symbol-filled disks 828-829. Under certain circumstances, the state of the asymmetric-switch nanoscale junction reflects the state of the input signal line latched by manipulation of the control signal lines. For example, as represented by the symbol-filled disk 828 in FIG. 8A, in certain situations, when the signal line is high, the asymmetric-switch nanoscale junction is placed into a closed state, and when the signal line is low, the asymmetric-switch nanoscale junction is placed into an open state. Similarly, as represented by the symbol-filled disk 829 in FIG. 8A, in other cases, the asymmetric-switch nanoscale junction may be closed when the input signal line is low, and opened when the signal line was high.

FIG. 8B illustrates a number of relative voltages that may be placed across nanoscale junctions during the course of operation of the NEL illustrated in FIG. 7. The large, positive voltage $V_{open}$ 830 is used, as described above, to open an asymmetric-switch nanoscale junction. The large negative voltage $V_{close}$ 832 is used to place an asymmetric-switch nanoscale junction in the closed state. The range of positive voltages between $V_{weak1}$ and $V_{strong1}$ 834 may be used for encoding a "1" binary value on the signal line, and negative voltages between the negative voltage $V_{weak0}$ and $V_{strong0}$ 836 may be used to encode a binary "0" value on the signal line.

FIGS. 9A-D illustrate operation of the nanoscale electronic latch shown in FIG. 7. FIGS. 9A-D use the illustration conventions discussed above with reference to FIG. 8A. In an initial state 902, the NEL is inactive, and the input signal S is transmitted through the NEL on the signal line 804.

In a next sequence of operations, the NEL is prepared to receive and latch a binary value from the signal line. First, as shown in the NEL representation 904, the voltage applied to the enable line 810 is decreased below $V_T$ to open the FET-like nanoscale junction 806. Then, a large positive voltage $V_{open}$ is applied to control line B 812 to open the asymmetric-switch nanoscale junction 808. Next, as shown in NEL-representation 906, a large negative voltage greater or equal in magnitude than $V_{close}$ is applied to control line A 811 in order to close asymmetric-switch nanoscale junction 807. Next, as shown in NEL representation 908 in FIG. 9B, the FET-like nanoscale junction 806 is closed by application of a voltage greater than $V_T$ to the enable line 810. Thus, the current signal input via the signal line 804 is passed through the NEL. Then, in the NEL representation 910 in FIG. 9B, a voltage V less than $V_{open}$ but greater than $V_{strong1}$ is applied to control A 811. If the signal line is high, then the voltage applied across the asymmetric-switch nanoscale junction 807 is below $V_{open}$, and the asymmetric-switch nanoscale junction remains closed. However, if the signal line is low, then the voltage applied across the asymmetric-switch nanoscale junction 807 is greater than $V_{open}$, and the asymmetric-switch nanoscale junction 807 is opened by the applied voltage. As discussed above with reference to FIG. 8A, the symbol-filled disk 807 represents the fact that the state of the asymmetric-switch nanoscale junction depends on the signal latched by application of the voltage V to control A 811. Next, as shown in NEL representation 912 in FIG. 9B, the FET-like nanoscale junction 806 is disabled by application of a voltage less than $V_T$ to the enable line 810. Next, as shown in NEL representation 914 in FIG. 9C, a relatively large negative voltage $-(V_{strong1})$ is applied to control A 811. If asymmetric-switch nanoscale junction 807 is closed, then the output signal line 916 has a low voltage. If, on the other hand, the asymmetric-switch nanoscale junction 807 is open, then the output signal line 916 is at ground. Thus, application of the negative voltage $-(V_{strong1})$ to the control-A signal line inverts the latched input signal. Next, as shown in NEL representation 918 in FIG. 9C, the negative voltage $V_{close}$ is applied to control D 812, placing the asymmetric-switch nanoscale junction 808 in an open state, when the latched signal S is high, and placing the asymmetric-switch nanoscale junction 808 in a closed state when the latched signal S is low. Thus, the state of the second asymmetric-switch nanoscale junction 808 is opposite from the state of the first asymmetric-switch nanoscale junction 807. This completes latching of the signal S input into the NEL in the step discussed with reference to NEL representation 910 in FIG. 9B.

Figure 9A:
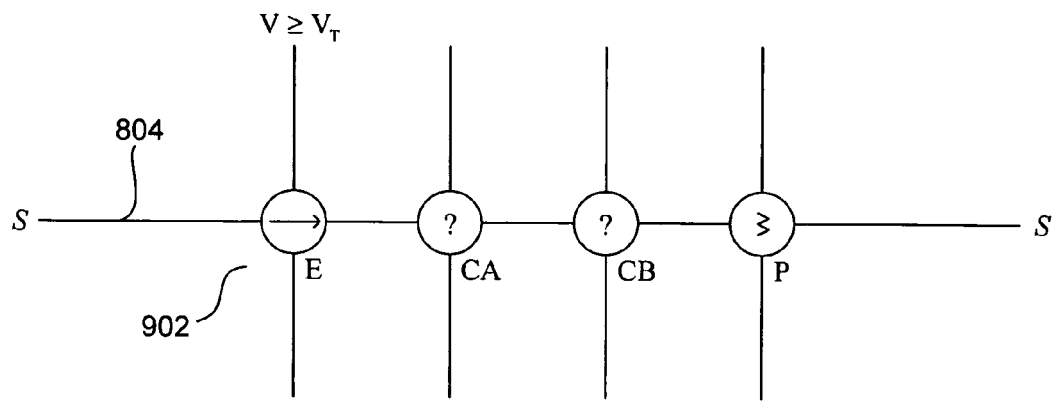
FIGS. 9A-D illustrate operation of the nanoscale electronic latch shown in FIG. 7.
Figure 9A:
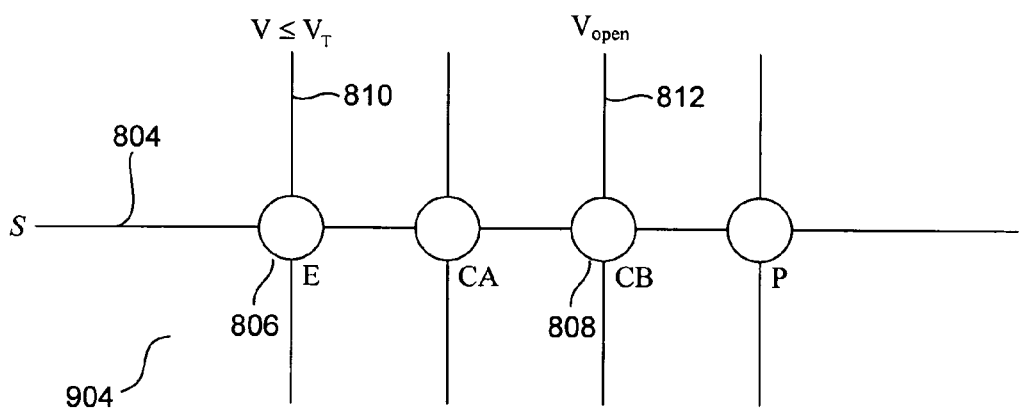
Figure 9A:
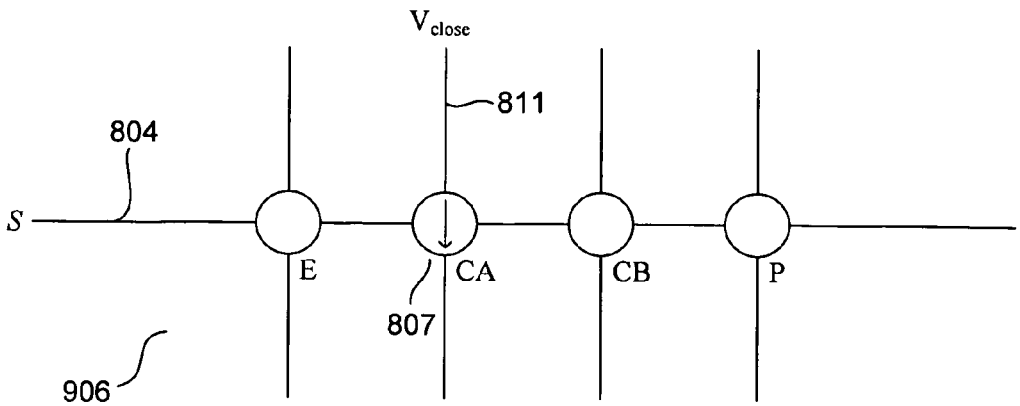
Figure 9B:
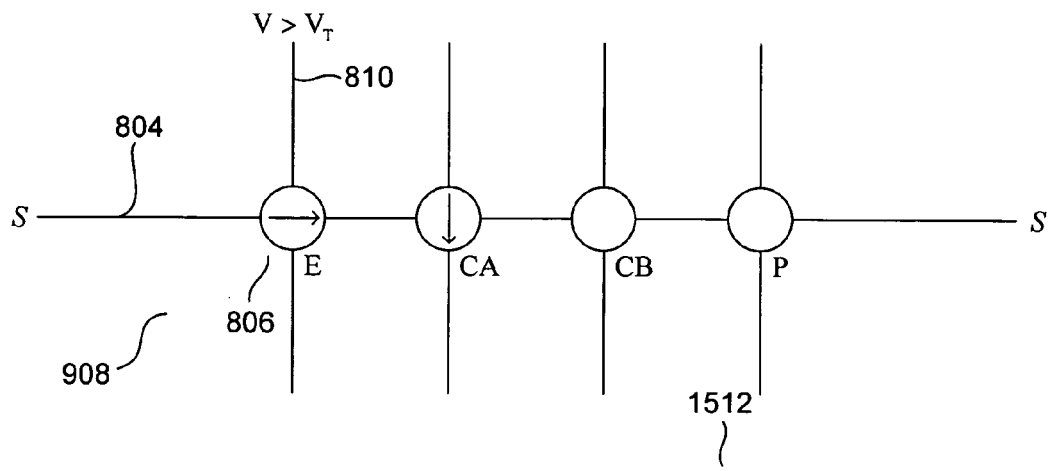
Figure 9B:
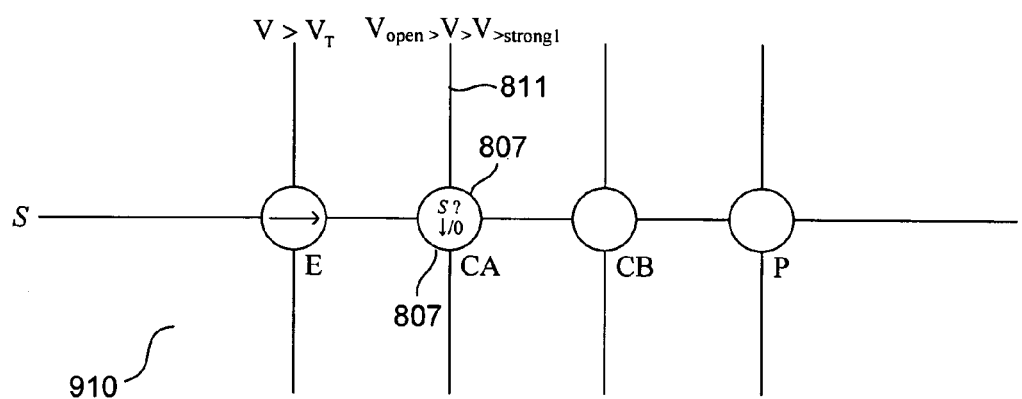
Figure 9B:
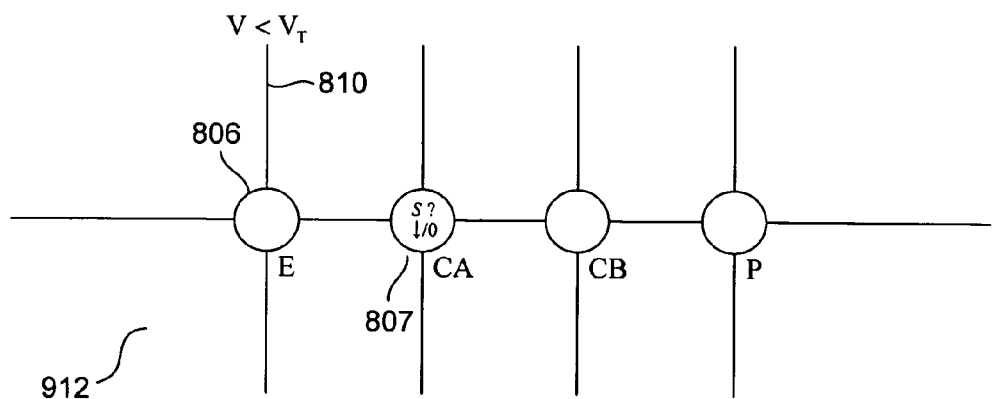
Figure 9C:
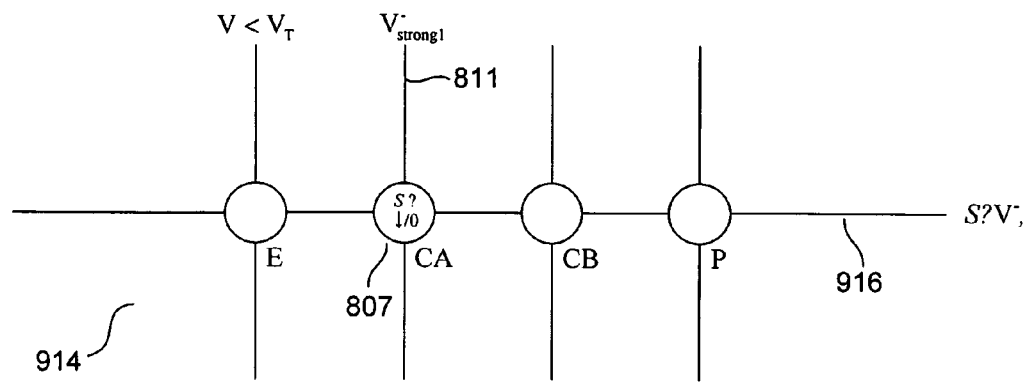
Figure 9C:
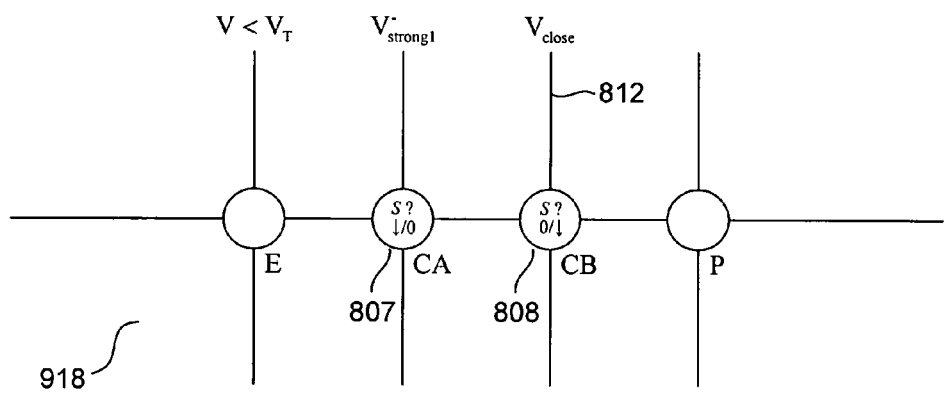
Figure 9C:
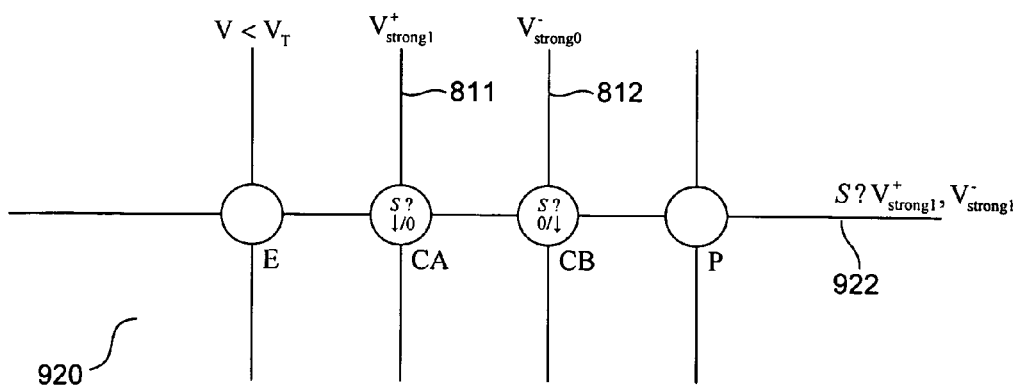
Figure 9D:
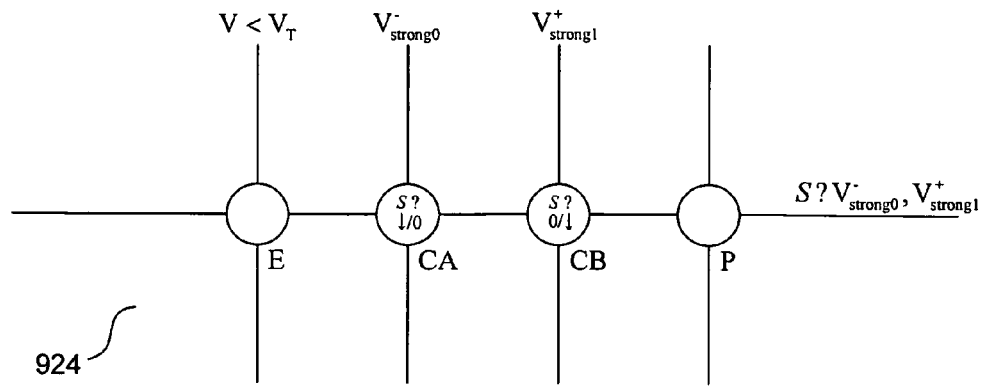
Figure 9D:
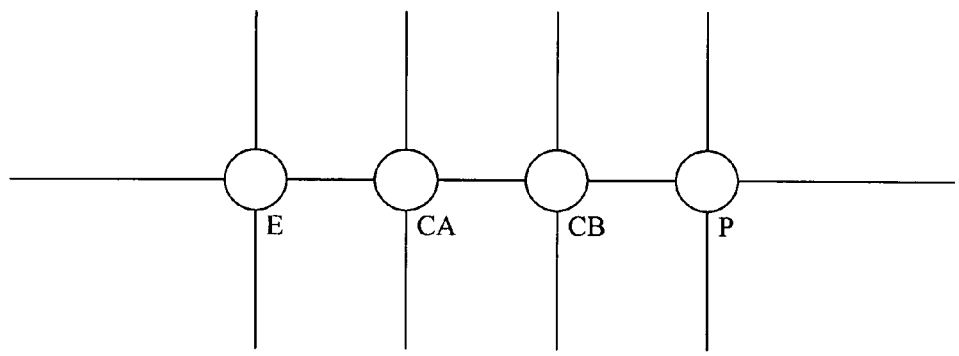
Figure 9D:
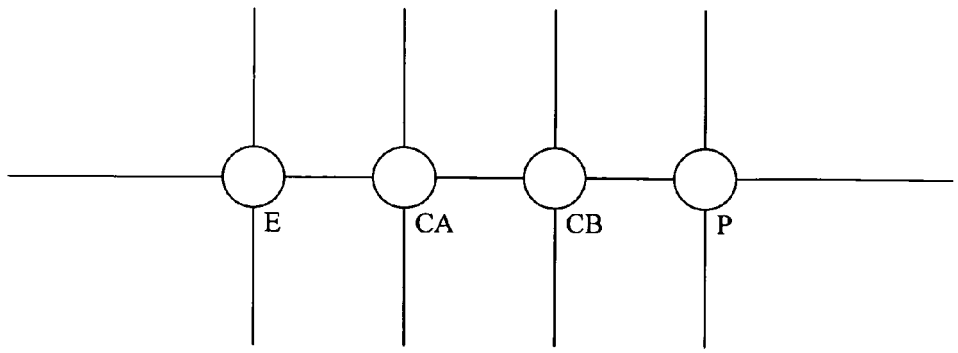

In order to output the latched binary value, as shown in NEL representation 920 in FIG. 9C, the positive voltage $V_{strong1}$ is applied to the control-A signal line 811 and the negative voltage $V_{strong0}$ is applied to the control-B signal line 812. When the latched signal value S is high, a large positive voltage $V_{strong1}$ is output, while when the latched signal value S is low, the negative voltage $V_{strong0}$ is output 922. Output of the inverted latched value can be accomplished by reversing the voltages applied to the control-A and control-B signal lines, as shown in NEL representation 924 in FIG. 9D.

Figure 10:
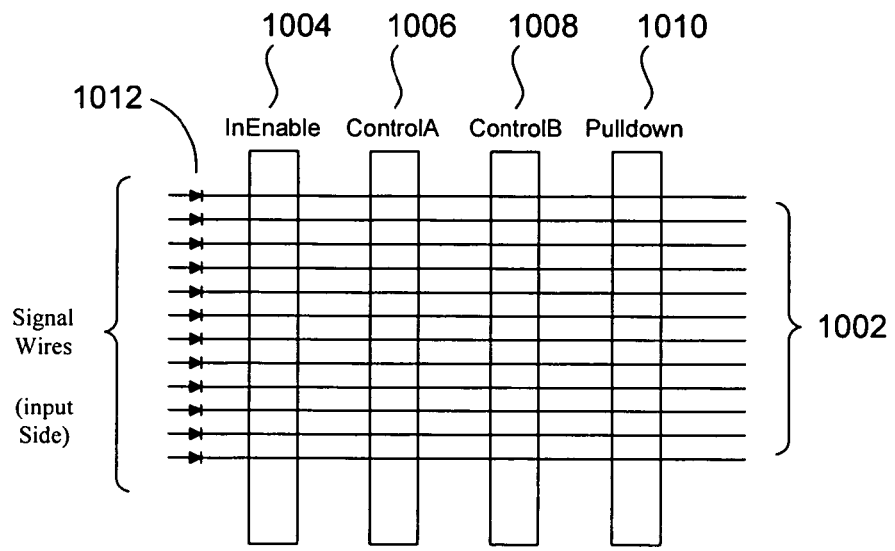
FIG. 10 illustrates an array of nanoscale electronic latches.

FIG. 10 illustrates an array of nanoscale electronic latches. The array of NELs is fabricated by interconnecting a set of parallel nanowire signal lines 1002 with microscale enable 1004 control-A 1006, control-B 1008, and pull-down 1010 signal lines, with the microscale signal lines interconnected to the nanowire signal lines 1002 through FET-like, asymmetric-switch-like, and resistive nanoscale junctions, as shown in FIG. 7. In certain embodiments, enable, control, and pull-down lines may also be nanoscale signal lines. In alternative embodiments, a two-dimensional array of latches is obtained by fabricating a series of NELs across a set of parallel nanowires. A myriad different nanoscale and mixed nanoscale/microscale NEL-containing circuits can be fabricated using the NEL described above with reference to FIG. 7, since both asymmetric-switch nanoscale junctions in the NEL have the same polarity. In previously described NELs, the two asymmetric-switch nanoscale junctions have opposing polarities, less easily and more expensively manufactured by current methodologies.

Figure 11:
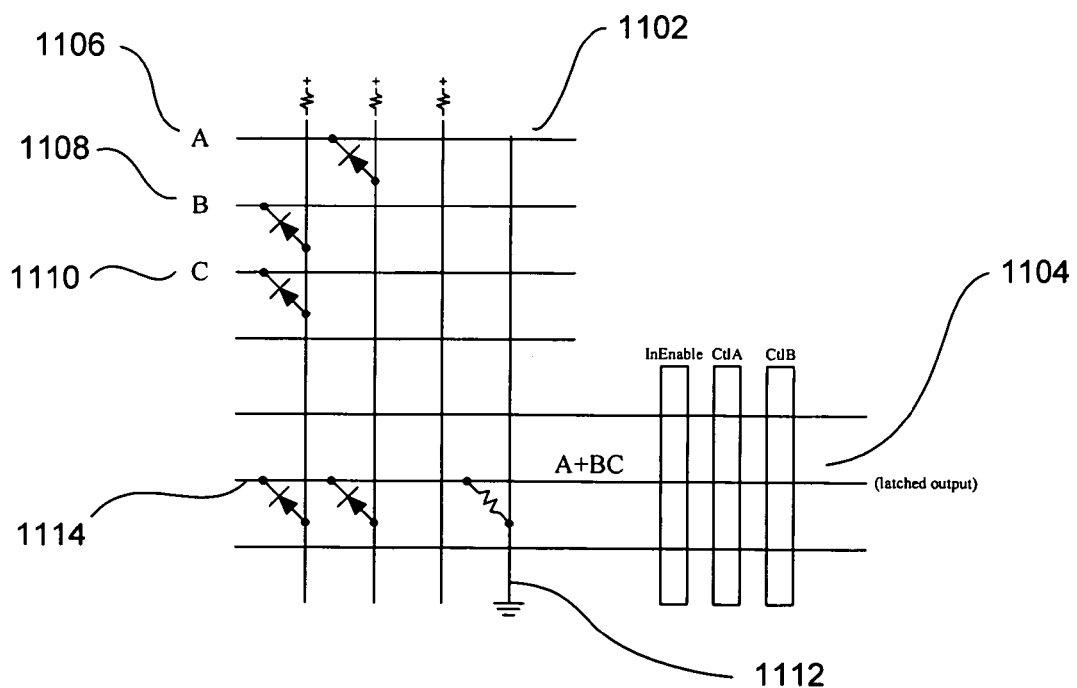
FIG. 11 provides an exemplary nanowire-crossbar-based circuit in which a nanoscale electronic latch of the present invention is incorporated.

FIG. 11 provides an exemplary nanowire-crossbar-based circuit in which a nanoscale electronic latch of the present invention is incorporated. A resistor-diode nanoscale logic component 1102 is interconnected with a NEL 1104 of the present invention to enable latching of the binary value "A+BC" produced by the nanoscale circuit 1102 from input signals A 1106, B 1108, and C 1110. In this embodiment, no pull-down line is needed for the NEL, since pull-down line 1112 in the nanoscale circuit 1102 serves the same purpose. Furthermore, no distinct diode in FIG. 7 (704 in FIG. 7) and in the column 1012 in FIG. 10, are needed, since the diode/resistor nanowire crossbar circuit 1102 produces one-directional current along signal line 1114.

Although the present invention has been described in terms of particular embodiments, it is not intended that the invention be limited to these embodiments. Modifications within the spirit of the invention will be apparent to those skilled in the art. For example, an essentially limitless number of different nanoscale and mixed nanoscale/microscale circuits can be devised to incorporate the NEL of the present invention. The NEL can be fabricated at nanoscale, mixed nanoscale/microscale, and microscale dimensions from FET-like and asymmetric-switch junctions. Junctions with similar, but different, characteristics may also be incorporated in the NEL, with corresponding changes to enable and control-signal line voltage sequences and polarities. As discussed above, the pull-down line (714 in FIG. 7) may not be needed, when the source/drain line is grounded through resistance elsewhere in a circuit containing the NEL.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. An electronic latch comprising:
    a signal line on which a binary value is input for latching, and on which the latched binary value may be subsequently output;
    an enable signal line interconnected with the signal line by a FET-like junction that controls input of a binary value on the signal line to the electronic latch;
    a control-A signal line interconnected with the signal line by a first asymmetric-switch junction having a polarity; and
    a control-B signal line interconnected with the signal line by a second asymmetric-switch junction having the same polarity as the first asymmetric-switch function.

2. The electronic latch of claim 1 further including, when the signal line is not grounded through a resistive connection:
    a pull-down signal line connected with the signal line by a resistive junction and connected to ground.

3. The electronic latch of claim 2 wherein the signal line is a nanowire and the FET-like junction, asymmetric-switch junctions, and resistive junction are nanoscale junctions.

4. The electronic latch of claim 2 wherein the enable, control A, control B, and pull-down lines are each one of:
    a nanowire;
    a sub-micron-scale signal line; and
    a microscale signal line.

5. An array of electronic latches of claim 1, each electronic latch of the array of electronic latches having a different signal line, and all electronic latches of the array of electronic latches sharing common enable and control signal lines.

6. A two-dimensional array of electronic latches of claim 1, each electronic latch of a row of the two-dimensional array of electronic latches sharing a common signal line, and each electronic latch of a column of the two-dimensional array of electronic latches the array of electronic latches sharing common enable and control signal lines.

7. The electronic latch of claim 1 wherein an asymmetric-switch junction can be opened, by applying a positive voltage across the asymmetric-switch junction, and can be closed, by applying a negative voltage across the asymmetric-switch junction, the state of the asymmetric switch stable in a range of applied voltages between the closing voltage and the opening voltage.

8. The electronic latch of claim 1 wherein an encoded binary value input to the electronic latch on the signal line is latched by:
    latching the binary value in the first asymmetric-switch junction; and
    latching the binary value in the second asymmetric-switch junction.

9. The electronic latch of claim 1 wherein latching the binary value in the first asymmetric-switch junction further comprises:
opening the FET-like junction;
opening the second asymmetrical-switch junction;
closing the first asymmetrical-switch junction;
closing the FET-like junction to input a binary value to the latch; and
asserting a positive voltage on the control-A signal line so that the asymmetric-switch junction remains closed, when the binary value is high, and is opened, when the binary value is low.

10. The electronic latch of claim 1 wherein latching the binary value in the second asymmetric-switch junction further comprises:
opening the FET-like junction;
asserting a negative voltage on the control-A signal line; and
asserting a negative voltage on the control-B signal line so that the second asymmetrical-switch junction remains open, when the binary value is high, and closes, when the binary value is low.

11. The electronic latch of claim 1 wherein a latched binary value is output to the electronic latch on the signal line by:
while the FET-like junction is open,
asserting a positive voltage on the control-A signal line and asserting a negative voltage on the control-B signal line.

12. The electronic switch of claim 1 wherein an inverted binary value corresponding to a latched binary value is output to the electronic latch on the signal line by:
while the FET-like junction is open,
asserting a negative voltage on the control-A signal line and asserting a positive voltage on the control-B signal line.

13. A method for implementing an electronic latch comprising:
providing a signal line on which a binary value is input for latching, and on which the latched binary value may be subsequently output;
interconnecting an enable signal line with the signal line through a FET-like junction that controls input of a binary value on the signal line to the electronic latch;
interconnecting a control-A signal line with the signal line through a first asymmetric-switch junction having a polarity; and
interconnecting a control-B signal line with the signal line through a second asymmetric-switch junction having the same polarity as the first asymmetric-switch function.

14. The method of claim 13 further including, when the signal line is not grounded through a resistive connection:
interconnecting a pull-down signal line with the signal line through a resistive junction and connected to ground.

15. The method of claim 14 wherein the signal line is a nanowire and the FET-like junction, asymmetric-switch junctions, and resistive junction are nanoscale junctions.

16. The method of claim 13 wherein an encoded binary value input to the electronic latch on the signal line is latched by:
latching the binary value in the first asymmetric-switch junction; and
latching the binary value in the second asymmetric-switch junction.

17. The method of claim 16 wherein latching the binary value in the first asymmetric-switch junction further comprises:
opening the FET-like junction;
opening the second asymmetrical-switch junction;
closing the first asymmetrical-switch junction;
closing the FET-like junction to input a binary value to the latch; and
asserting a positive voltage on the control-A signal line so that the asymmetric-switch junction remains closed, when the binary value is high, and is opened, when the binary value is low.

18. The method of claim 16 wherein latching the binary value in the second asymmetric-switch junction further comprises:
opening the FET-like junction;
asserting a negative voltage on the control-A signal line; and
asserting a negative voltage on the control-B signal line so that the second asymmetrical-switch junction remains open, when the binary value is high, and closes, when the binary value is low.

19. The method of claim 13 wherein a latched binary value is output to the electronic latch on the signal line by:
while the FET-like junction is open,
asserting a positive voltage on the control-A signal line and asserting a negative voltage on the control-B signal line.

20. The method of claim 13 wherein an inverted binary value corresponding to a latched binary value is output to the electronic latch on the signal line by:
while the FET-like junction is open,
asserting a negative voltage on the control-A signal line and asserting a positive voltage on the control-B signal line.

* * * * *

UNITED STATES PATENT AND TRADEMARK OFFICE
CERTIFICATE OF CORRECTION

| | |
|---|---|
| PATENT NO. | : 7,436,209 B1 |
| APPLICATION NO. | : 11/590491 |
| DATED | : October 14, 2008 |
| INVENTOR(S) | : Gregory S. Snider et al. |

It is certified that error appears in the above-identified patent and that said Letters Patent is hereby corrected as shown below:

In column 2, line 50, delete "$CS_{1,2}$" and insert -- $CS_{i,2}$ --, therefor.

In column 4, line 1, after "potential" delete "A" and insert -- $\Delta$ --, therefor.

In column 8, line 31, in Claim 1, delete "function." and insert -- junction. --, therefor.

In column 9, lines 50-51, in Claim 13, delete "function." and insert -- junction. --, therefor.

Signed and Sealed this

Fourteenth Day of July, 2009

JOHN DOLL
*Acting Director of the United States Patent and Trademark Office*